(12) United States Patent
Clemens et al.

(10) Patent No.: US 6,272,039 B1
(45) Date of Patent: Aug. 7, 2001

(54) TEMPERATURE INSENSITIVE CAPACITOR LOAD MEMORY CELL

(75) Inventors: James T. Clemens, Watchung; Philip W. Diodato, Asbury; Yiu-Huen Wong, Summit, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/498,543

(22) Filed: Feb. 4, 2000

Related U.S. Application Data (63) Continuation-in-part of application No. 09/189,131, filed on Nov. 9, 1998, now Pat. No. 6,038,163.

(51) Int. Cl.⁷ .................................................. G11C 11/00
(52) U.S. Cl. .......................................... 365/154; 365/149
(58) Field of Search ................................. 365/154, 149, 365/102, 153, 180

(56) References Cited

U.S. PATENT DOCUMENTS

| | | | |
|---|---|---|---|
| 3,662,356 | 5/1972 | Michon et al. | 340/173 FF |
| 4,223,333 | 9/1980 | Masuoka | 357/41 |
| 5,485,420 | * 1/1996 | Lage et al. | 365/154 |
| 5,825,684 | * 10/1998 | Lee | 365/154 |

FOREIGN PATENT DOCUMENTS

| | | | |
|---|---|---|---|
| 551756A1 | 7/1993 | (EP) | G11C/14/00 |
| 0609081A2 | 8/1994 | (EP) | H01L/21/32 |
| 61-224196 | 10/1986 | (JP) | G11C/11/40 |

\* cited by examiner

*Primary Examiner*—Trong Phan
*Assistant Examiner*—Thong Le
(74) *Attorney, Agent, or Firm*—Thomas, Kayden, Horstemeyer & Risley LLP (57) ABSTRACT

An apparatus and method for constructing a temperature insensitive memory cell. This temperature insensitive memory cell operates as a static random access memory (SRAM) cell if a particular capacitor and transistor configuration is used. The temperature insensitive memory cell apparatus includes at least one transistor having a current leakage, and at least one capacitor electrically connected to the transistor. The capacitor acts as a load element for the memory cell. The capacitor has a temperature dependent capacitor leakage that tracks the current leakage of transistor as said at least one transistor as the transistor varies with temperature.

17 Claims, 7 Drawing Sheets

TEMPERATURE INSENSITIVE CAPACITOR LOAD MEMORY CELL

CROSS-REFERENCE TO RELATED APPLICATIONS

This application is a continuation-in-part of U.S. utility application entitled, "CAPACITOR LOADED MEMORY CELL" filed on Nov. 9, 1998 and accorded Ser. No. 09/189,131, now U.S. Pat. No. 6,028,163 which is entirely incorporated herein by reference.

BACKGROUND OF THE INVENTION

1. Field of the Invention

The present invention generally relates a memory cell and, more particularly, is related to an apparatus and method using advanced capacitor dielectrics in the construction of a random access memory (RAM) memory cell.

2. Description of Related Art

As is well known in the art, there are basically two types of metal oxide semiconductor (MOS) random access memories (RAMS): static and dynamic. A static RAM or SRAM is a form of semiconductor memory based on the logic circuit known as a flip-flop, which retains information as long as there is enough power to operate the device. These flip-flops have to be simple in order to minimize the silicon area per cell, which is very important since the cell array constitutes by far the largest part of the memory chip. One problem with standard SRAMs is their large size, owing to the use of six transistors in each memory cell where all six are aligned in one plane of the silicon wafer containing them.

Dynamic RAMs (DRAMs) on the other hand store binary data on capacitors resulting in a further reduction in cell area at the expense of more elaborate read/write circuitry. The binary data stored in DRAMs is in the form of the charge on the capacitor. Due to various leakage effects (i.e. current drain) that are inevitably present, the capacitor charge will eventually leak off. Thus, to ensure proper operation of DRAMs, a refresh operation must be completed periodically.

During the refresh operation, the DRAM memory cells' content is read and the data stored therein is rewritten, thus restoring the capacitor charge to its proper value. The refresh operation must be performed every few milliseconds (e.g. eight to sixteen milliseconds) and thus implies the necessity of having a clock connection to the DRAM circuit. This periodic refresh operation required in the DRAMs operation requires that additional refresh circuitry be included in the design, thereby increasing the surface area of the circuit.

Regardless of the refresh operation, DRAMs are preferred over SRAMs. This is because the DRAM memory cell has significantly fewer components and as a result, the DRAMs achieve greater packing density than is possible with any static RAM. Despite being slower, DRAMs are more commonly used than SRAMs because of the smaller DRAM cell design that allows a DRAM to hold up to four times as much data as a SRAM within the same surface area on the integrated circuit.

However, there have been problems in the past constructing capacitors on integrated circuits for usage in a RAM. Discrete capacitors using high dielectric constant films of Silicon (Si) and Silicon Oxide ($SiO_2$) have been studied since the 1950s. Nevertheless, incompatibilities with the Si—$SiO_2$ technology progression have inhibited these dielectrics from being used in an integrated circuit manufacturing environment.

Several attempts have been made to merge high dielectric discrete capacitors and DRAM technologies in a brute force manner by either inserting existing access-transistor and stacked-capacitor fabrication modules below the first level metal interconnect of their Application Specific Integrated Circuit (ASIC) technology or by burying a trench-capacitor underneath an access-transistor.

The first approach leads to a technology that has a high mask count, and is somewhat problematic because of the introduction of additional thermal cycles to the fabrication process and the increased aspect ratio of the contact window etch in the first level metal interconnect intended for the ASIC transistors.

The trench-capacitor approach is more reasonable from a processing point of view, however, it is not considered scalable. This scalability problem is due to difficulty associated with depositing advanced dielectrics in a deep trench.

Heretofore, manufactures have been unable to fulfill the aspiration of providing a RAM memory cell with temperature insensitivity and a high speed of access along with reduced circuit complexity and size.

SUMMARY OF THE INVENTION

Certain advantages and novel features of the invention will be set forth in part in the description that follows and in part will become apparent to those skilled in the art upon examination of the following or may be learned with the practice of the invention.

To achieve the advantages and novel features, the present invention is generally directed to an apparatus and method for the utilization of a capacitor as a load element in a temperature insensitive memory cell. In the context of the present invention, "load element" is used to indicate that semiconductor current (which is not quantum tunneling related) is passed through the capacitor to the transistor.

Briefly described, in architecture, the system can be implemented as follows. A temperature insensitive capacitor load memory cell utilizes a capacitor to obtain an offset current path through an analogous parasitic resistor of sufficient magnitude to offset other leakage currents from one or more transistors of the memory cell. This offset current, along with a particular capacitor/transistor interconnection, will regulate the logic levels in the memory cell to settle the memory cell into a static state. The capacitor has a temperature dependent capacitor leakage that tracks the current leakage of the one or more transistors of the memory cell, as the one or more transistors vary with temperature.

The present invention can also be viewed as providing a method for constructing a temperature insensitive memory cell. In this regard, the following steps can broadly summarize the method. First, a substrate is provided. Next, a source contact and a drain contact are formed on the substrate using a field oxide layer. A gate electrode is formed on top of the field oxide to create a transistor. A first contact is formed on the source contact. Next, a first metal layer bit line is formed on the first contact to connect the first contact to the first metal layer bit line. A second contact is formed on the drain contact. A first plug is fabricated on the second contact, and a capacitor is formed on the first plug. The capacitor includes a dielectric having a temperature dependent capacitor leakage that tracks a current leakage of the transistor as the transistor varies with temperature. Next, a second metal layer is formed on the capacitor. A second plug is fabricated on the second metal layer, and a third metal layer is formed on the second plug.

Other features and advantages of the present invention will become apparent to one with skill in the art upon examination of the following drawings and detailed description. It is intended that all such additional features and advantages be included herein within the scope of the present invention

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENT

Reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications, and equivalents included within the scope of the invention as defined by the appended claims.

Figure 1:
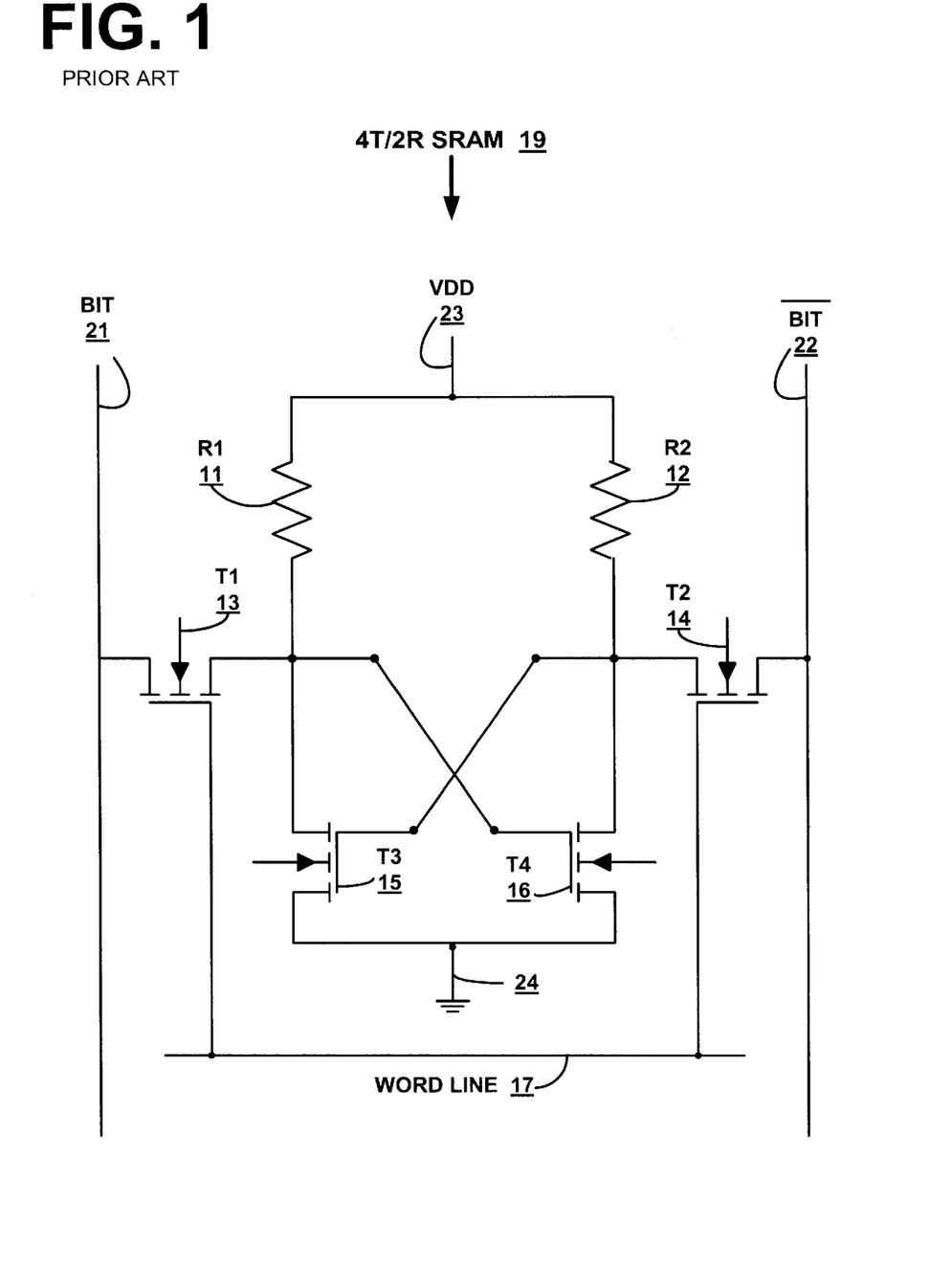
FIG. 1 is a schematic of a typical example of a prior art four- (4) transistor and two- (2) load resistor static RAM cell circuit.
Figure 2:
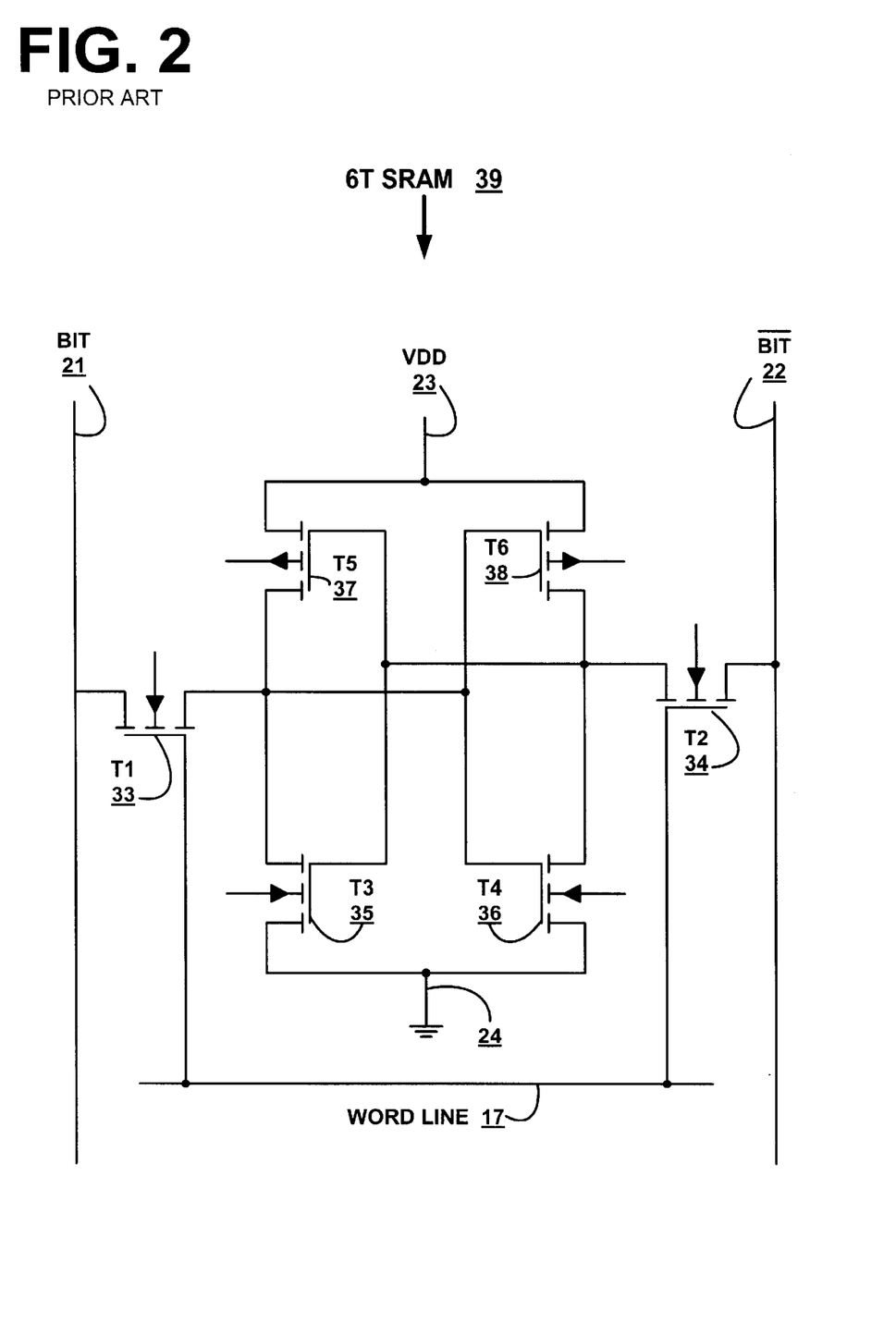
FIG. 2 is a schematic of a typical example of a prior art six- (6) transistor static CMOS RAM cell circuit.

Illustrated in FIGS. 1 and 2, are typical static RAM cells utilizing MOS technology. Each of the cells shown in FIGS. 1 and 2 consist of a flip-flop, formed by the cross coupling of two inverter transistors T3 and T4 (items 15, 16, 35 and 36 in FIGS. 1 & 2 respectively), and two access transistors T1 and T2 (items 13, 14, 33 and 34 in FIGS. 1 & 2 respectively). The access transistors T1 and T2 are turned on when the word line 17 is selected (i.e., raised in voltage) and the access transistors are connected to the flip-flop and connect the flip-flop to the column bit line 21 and $\overline{BIT}$ 22. The access transistors T1 and T2 act as transmission gates that control bi-directional current flow between the flip-flops and the bit line 21 and $\overline{BIT}$ line 22. In FIG. 1, the 4T/2R SRAM 19 utilizes load resistors R1 11 and R2 12 that are formed in a polysilicon layer via an additional processing step. These large valued resistors can be fabricated in such a way that the result is low power dissipation per cell.

Access to the SRAM memory cells 19 and 39 in FIGS. 1 and 2 respectively, is realized when the voltage on the word line 17 is raised, thus turning on transistors T1 and T2 (13, 14, 33 and 34). In this way, one side of the cell flipflop is connected to the bit line and the other side is connected to the $\overline{BIT}$ line 22.

Referring to FIG. 2, a read instruction of the SRAM 39 is as follows. Assuming that the cell is storing a logic-level zero, transistor T3 (35) is on and T4 (36) is off. Before the read operation begins, the voltage of bit line 21 and $\overline{BIT}$ line 22 are precharged to VDD 23 or some other suitable voltage. When transistors T1 33 and T2 34 are turned on, the current flows from the bit line 21 through transistors T1 33 and T3 35 to ground. This causes a drop in voltage on bit line 21. Simultaneously, current flows from VDD 23 through transistors T6 38 and T4 36 and on to the bit line 21, causing a small decrease in bit line 21 voltage. The voltage signal that appears between bit line 21 and $\overline{BIT}$ line 22 is then fed into a column sense amplifier (not shown). Only the sense amplifier in the selected column will be active and its output is connected to the data output line of the chip.

In a write operation, the data bit to be written, and its complement, are transferred to bit line 21 and $\overline{BIT}$ line 22, respectively. Thus, if a logic-level one is written, the voltage on bit line 21 is raised to VDD 23 and the voltage on $\overline{BIT}$ line 22 is lowered to ground. The conducting transistors T1 33 and T2 34 then cause the high voltage to appear at the gate of transistor T4 36 and a low voltage to appear at the gate of transistor T3 35. The flip-flop is then forced into a state in which the drain of transistor T3 35 is high and that of transistor T4 36 is low. This state, which denotes a stored logic-level one, will remain a logic-level one indefinitely or until changed by another write operation or until power is interrupted.

Static RAMs can maintain their contents indefinitely as long as the power supply is connected. While a clock is usually used for gating and synchronization, a clock is not necessary for a memory chip operation in a static RAM. A dynamic RAM on the other hand requires a clock to control the periodic refresh operation.

Figure 3:
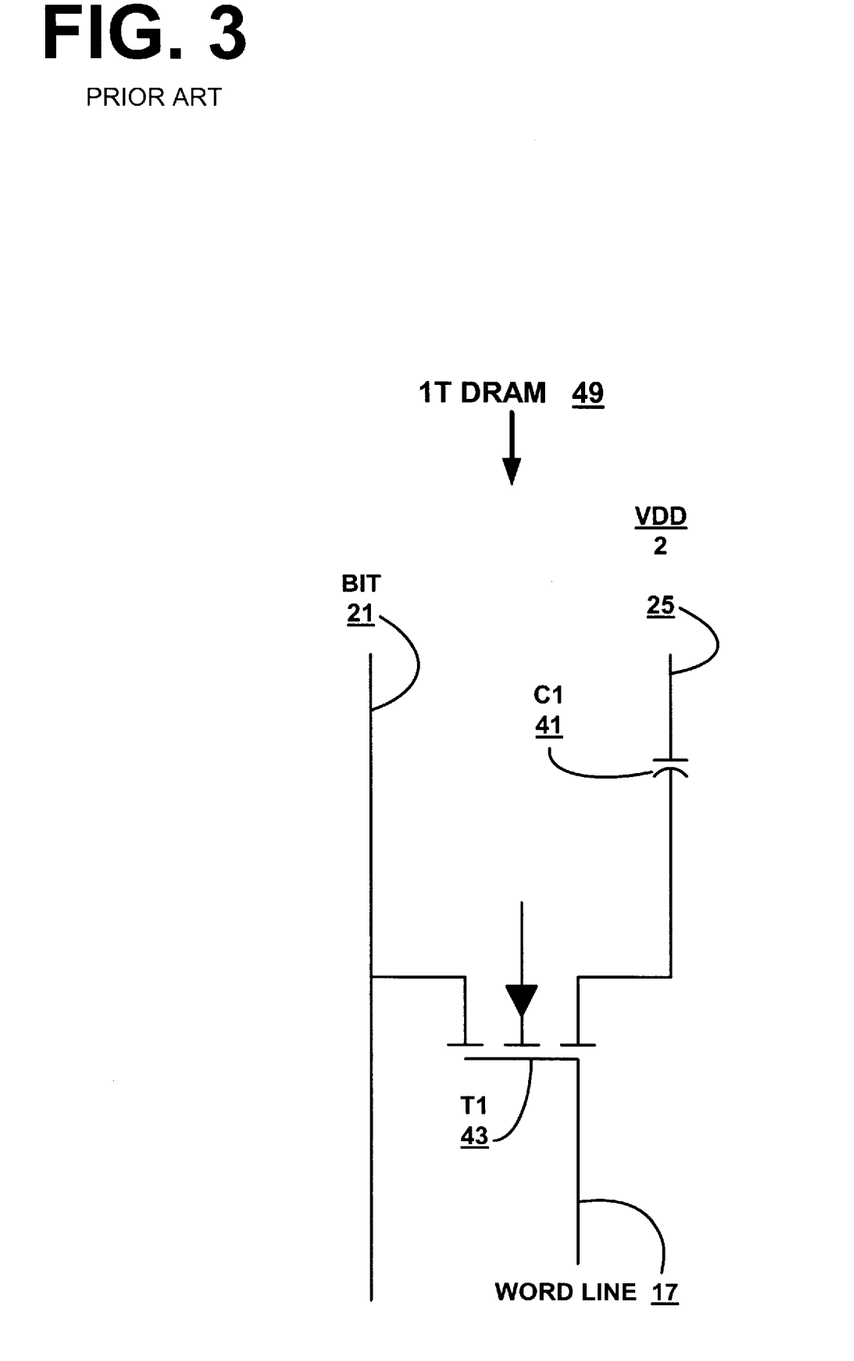
FIG. 3 is diagram of a typical example of a prior art single transistor single capacitor dynamic RAM cell circuit.
Figure 4:
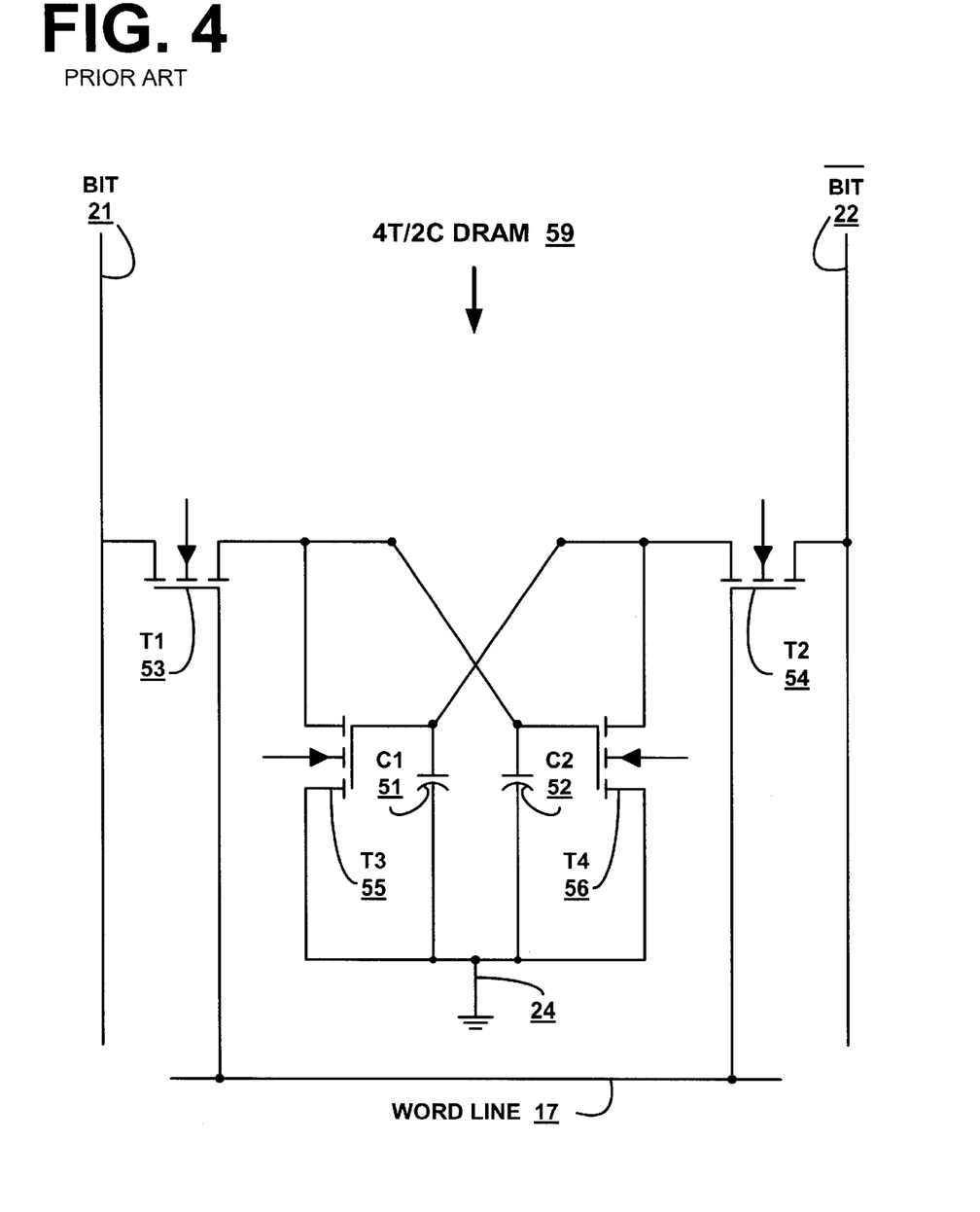
FIG. 4 is a diagram of a typical example of a prior art four- (4) transistor and two- (2) capacitor dynamic RAM cell circuit.

Illustrated in FIGS. 3 and 4, are typical memory cells utilizing dynamic RAM (DRAM) configuration. DRAMs store information in integrated circuits by utilizing capacitors. A logic zero is represented by a voltage close to zero. A logic level one is represented by a capacitor voltage of a value closer to that of the power supply VDD 25.

Because, as noted above, capacitors in the DRAM memory lose their charge over time, DRAM memory must include logic to periodically refresh (i.e., recharge) the DRAM circuits. During the refresh, the cells' content is read and the bit data is rewritten, thus restoring the capacitor voltage to its proper value. However, while a DRAM is being refreshed, it cannot be read by another device. Thus, if another device attempts to read the DRAM while it is being refreshed, the device must wait one or more wait states until the refresh operation is completed.

A refresh operation must be performed frequently (e.g. every eight to sixteen milliseconds). The need for periodically refreshing a dynamic memory chip implies a necessity of having a periodic refresh signal as noted above. The periodic refresh operation necessary in a DRAM requires additional circuitry that is known to those skilled in the art and is omitted from the figures for simplicity.

Illustrated in FIG. 3 is the most common storage cell utilizing a DRAM. This cell 49 is known as a one transistor (1T DRAM). The cell 49 consists of a single transistor T1 43, known as the access transistor, and a storage capacitor C1 41.

The gate of the transistor T1 43 is connected to the word line 17 and its drain is connected to the bit line 21 line. (As in any memory, a row decoder (not shown) selects a particular row by asserting a voltage on the word line 17.) This causes all the transistors in a selected row to be conductive and thereby connecting the storage capacitors of the cells in the selected row to their respective bit lines.

Thus, the storage capacitor C1 41 is connected to the bit line 21 as indicated in FIG. 3. Now, if the operation is a read and the cell is storing a logic-level one, then the voltage of the storage capacitor C1 41 will cause a positive increment to appear across bit line 21. Since the bit line 21 capacitance is much greater than storage capacitor C1 41, the voltage (or charge) increment on bit line 21 will be much smaller than the initial voltage on storage capacitor C1 41. Obviously, if the cell is storing a logic-level zero, then there will be a negative increment of voltage (or charge) appearing on bit line 21 (with respect to its initial state).

The change in voltage on the bit line 21 is detected and amplified by the column sense amplifiers (not shown). The amplified signal is then impressed on the storage capacitor C1 41, thus restoring the signal to the proper level. In this way, all cells on the selected row are refreshed. Simultaneously, the signal at the output of a sense amplifier of the selected column is fed into the data output line of the chip.

The write operation proceeds similarly to the read operation, except that the data bit to be written, which is impressed upon the bit line 21 is applied to the column decoder (not shown) to the selected bit line 21. This data bit is then stored on capacitor C1 41 of the selected cell. Simultaneously, all other cells in the selected row are also written with specific information.

Although read and write operations result in automatic refreshing of the selected row, provisions must be made for the frequent periodic refreshing of the entire memory (e.g. every eight to sixteen milliseconds) as specified for a particular integrated circuit. The refresh operation is carried out in burst mode one row at a time. During refresh, the chip normally will not be available for external read or write operations.

Illustrated in FIG. 4 is a four transistor, two capacitor DRAM 59 memory cell. In the DRAM 59 memory cell, gated excitation of each load is supplied by word line 17. The transistors T1 53 and T2 54 act simultaneously as load and row selection transistors. If the voltage on word line 17 is at or near zero, then transistors T1 53 and T2 54 are off and no information can be written into or read out of the DRAM 59 memory cell. However, if the voltage on word line 17 represents a logic-level one, then transistors T1 53 and T2 54 are on and the four transistors form a latch which can store a one (T1 56 is on) or a zero (T3 55 is on).

As with DRAM 49 in FIG. 3, information in the DRAM 59 memory cell is stored in the capacitor C1 51 and C2 52 between the gate and the source of transistors T3 55 and T4 56 respectively. If a digital one is stored, then C2 52 is charged with the voltage (VDD-Vth) where Vth is the access transistor threshold voltage, and capacitor C1 51 is maintained at a voltage of zero. If the converse is true, the capacitor C2 52 is maintained at a voltage of zero and capacitor C1 55 is charged to the voltage (VDD-Vth).

If, after the data is stored in DRAM 59 memory cell and is not accessed for some time, the charge on the capacitor decreases because of the inevitable leakage currents. If the time between writing the data and the next access exceeds the time that the capacitor can maintain voltage at VDD-Vth, the logic level one voltage may become small enough to be indistinguishable from logic level zero. The results in the information contained in the DRAM 59 memory cell being lost. The same phenomenon is the reason why dynamic shift registers cannot be operated below a minimum operating frequency. Clearly, some additional circuitry is required to refresh the stored data before the drop in voltage capacitors C1 51 and C2 52 becomes excessive.

Figure 5:
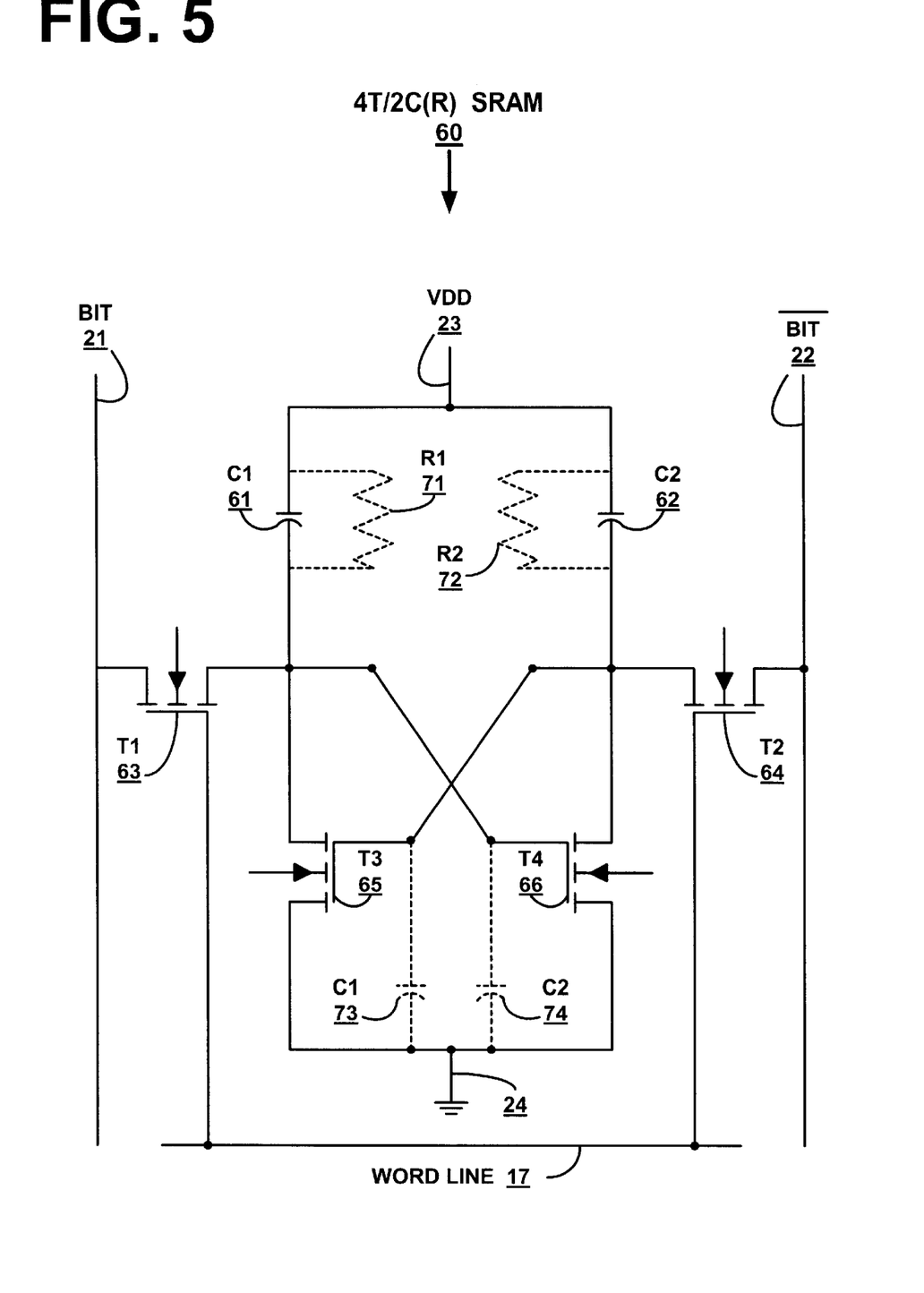
FIG. 5 is a circuit diagram of a four- (4) transistor and two- (2) capacitor static random access memory cell circuit of the present invention, with intentional conduction paths through the parasitic resistors.

Illustrated in FIG. 5 is a four transistor, two capacitor (4T/2C) static random access memory 60 embodying the principles of the present invention. The 4T/2C SRAM 60 includes the parasitic resistance of capacitors C1 61 and C2 62 that is reflected as the current leakage through R1 71 and R2 72. Normally, capacitors are not obvious load elements in an SRAM cell because the intrinsic nature of a capacitor blocks (or prevents) the high voltage of the power supply from reaching the transistor elements of the SRAM cell. (See Essentials of Radio-Electronics, 2nd edition, Slurzberg and Osterheld, McGraw-Hill, page 173). The present invention takes into account the secondary effect of leakage (i.e., current drain) of high dielectric constant based dielectrics, used in the construction of the capacitor, to modify the capacitor's current blocking nature. This modification allows a sufficient amount of current to flow into the memory cell so that a positive feedback is guaranteed and static operation is ensured.

The capacitor load memory circuit of the present invention takes advantage of the controlled current leakage (i.e., current drain) to the power supply. The current leakage of a capacitor, can be controlled utilizing any one of a variety of different methods including, but not limited to, the type of dielectric material used, the surface area of the capacitor, the annealing condition during fabrication, the dopant level included during fabrication, and/or the actual thickness of the dielectric material.

The 4T/2C SRAM 60 of the present invention also includes a flip-flop formed by a cross coupling of two inverters and two access transistors T1 63 and T2 64. The access transistors T1 63 and T2 64 are turned on when the word line 17 is selected (i.e., raised in voltage), and the access transistors T1 63 and T2 64 connect the flip-flop to bit line 21 and $\overline{\text{BIT}}$ line 22. In accordance with an aspect of the invention, both bit line 21 and $\overline{\text{BIT}}$ line 22 are utilized. The access transistors T1 63 and T2 64 act as transmission gates allowing bi-directional current flow between the flip-flop and the bit line 21 together with $\overline{\text{BIT}}$ line 22.

A significant aspect of this disclosure is the recognition that capacitor C1 61 and C2 62 can be advantageously used instead of load resistors R1 11 and R2 12 of the prior art four (4) transistor two (2) resistor static random access memory cell shown and discussed above with regard to FIG. 1. The memory cell 60 of the present invention utilizes capacitors C1 61 and C2 62 to intentionally provide conduction paths for obtaining current through the parasitic resistors R1 71 and R2 72, respectively. The current leakage through the dielectric of capacitors C1 61 and C2 62, respectively, are reflected as parasitic resistors R1 71 and R2 72. The current leakage through the dielectric of capacitors C1 61 and C2 62 compensates (as temperature varies) for any other current leakage through the four transistors T1 63, T2 64, T3 65, and T4 66.

This compensation current, along with a particular capacitor and transistor interconnection as shown in FIG. 5 will regulate (i.e. control) the logic levels of the memory cell in such a way that they settle into a stable static state independent of the temperature of operation. Simply stated, the temperature dependent capacitor leakage of the present invention tracks the "slow to change" leakages found in the rest of the circuit as it varies with temperature. A tunneling current (for prior art capacitor dielectrics) cannot do this because the tunneling current is constant with temperature. All capacitors have frequency dependent impedance, however few have a finite impedance at 0 Hz (DC). The capacitors of the present invention, have a finite and uniquely appropriate value of impedance that can be adjust to match, and track, the Ioff of any set of transistors as the leakage current of the capacitors vary with temperature.

Furthermore, the use of capacitor controlled time and frequency dependent impedance, can result in memory cell designs that are relatively insensitive to temperature variations. This is because high value resistors typically introduce significant temperature dependencies, (which are non existent at low temperatures) and capacitors (that rely on quantum tunneling) are insensitive to temperature. Because high value resistors are made from very thin and lightly doped films, they are difficult to fabricate and do not have a stable temperature behavior. Specifically at low temperatures the vanishingly small number of dopants in a thin film resistor tend to "freeze out" and become electrically inactive (although they do contribute a valence electron to the conduction mechanism), which makes them appear as open circuits that are incapable of off-setting the transistors leakages. This is explained further in commonly assigned U.S. Pat. No. 5,283,500, to Kochanski, entitled "Flat Panel Field Emission Display Apparatus," herein incorporated by reference.

An example of the capacitors of the present invention have a nominal dielectric thickness of about 100 angstroms (Å), and use about 1 um$^2$ for the capacitor plate surface area. The preferred dielectric materials contemplated include, but are not limited to, Ta2O5 (tantalum pentoxide), TiO2 (titanium dioxide), BST (barium strontium titanate), ZTT (zirconium tin tintanate), and TiO (titanium oxide), or other capacitor dielectrics with a dielectric constant greater than about 10. These preferred dielectric materials enhance the designed current leakage to the power supply.

Current-voltage characteristics of a Ta2O5 or TiO2 capacitor (and other dielectrics with a dielectric constant greater than about 10) are controllable by designing the surface area of the capacitor, the annealing condition during fabrication, the dopant level included during fabrication, or the actual thickness of the dielectric material.

As is discussed with more detail hereinafter with regard to FIG. 6, the substitution of the capacitors for resistors necessitates some design changes. However, the substitution can substantially improve the manufacturability of the capacitor loaded memory cell. This is so because it is relatively easy to produce a monolithic capacitor of the required capacitance values on a limited surface area of an integrated circuit. Whereas, it is difficult to reproduce manufactured monolithic resistors of the required high resistance on the limited surface area of an integrated circuit.

A Ta2O5 or TiO2 capacitor (and other dielectrics with a dielectric constant greater than about 10) can operate at almost any current level that can be achieved in a reproducible manner. This is because the capacitor dielectrics have a controlled time and frequency dependent impedance. This controlled time and frequency dependent impedance compensates for temperature dependent and slow to change leakage mechanisms found in all circuits. The controlled time and frequency dependent impedance also stabilizes the circuit against the high frequency or transient events (i.e. alpha particles, ground bounce of the power supply, and the like) that tend to upset circuits such as memories.

The dielectric of each of the capacitors C1 61 and C2 62 is intentionally leaky, so as to provide effective resistance that corresponds to the load resistors R1 11 and R2 12 of FIG. 1, while at the same time tracks the Ioff current in the transistors.

The sole purpose of the load device is to replenish charge lost due to native leakage mechanisms (specifically transistor, junction and isolation). The current from the load device must be larger than the sum of those leakages by a sufficient amount. That amount must be large enough so that the load device current can account for the nominal as well as the statistical variations of the same leakage components.

In the preferred embodiment of the present invention, the controlled current leakage of the capacitor is about ten times that of the current leakage (i.e., current drain) of the transistor used in order to optimize the circuit. However, capacitors utilizing a current leakage range of five (5) times to twenty (20) times the current leakage of the transistor can be successfully used in the circuit. Nevertheless, the further the current leakage of the capacitor is from the optimized factor of about ten times the current leakage of the transistor used, the more likely the current leakage will have some impact on the circuit optimization.

As mentioned previously, the prior art uses poly-Si as the plate material, while the present invention uses a metal, such as for example, but not limited to, W (tungsten), TiN (titanium nitrogen) and TaN (tantalum nitrogen). Most people of ordinary skill in the art would agree that poly-Si plates are not good for this kind of capacitor, because the interface of the poly-Si and the TaO dielectric is not well behaved under high electric fields conditions. This is because the high electric fields tend to deplete carriers from the first few atomic layers of the poly-Si and make it function as an insulator (and therefore increasing the effective oxide thickness).

The capacitors of the present invention do not have this problem because the Ta2O5 or TiO2 type capacitor dielectrics (and other dielectrics with a dielectric constant greater than about 10) are deposited directly on metal plates. The very fact that a capacitor has a reserve of charge stored on its plates is what stabilizes the circuit against transients events.

In the present invention, the composition of the capacitor dielectric is Ta2O5, TiO2, BST, ZTT, TiO, or other capacitor dielectrics with a high dielectric constant layer. The Ta2O5, TiO2, BST, ZTT, TiO, or other capacitor dielectrics with a high dielectric constant layer is chosen because the current through its controlled time and frequency dependent impedance of capacitors C1 61 and C2 62 is greater than, and in the opposite direction of the associated transistor off current. The associated transistor off current (in some cases $10^{-12}$ amperes) provides an RC time constant of about $10^{-3}$ seconds.

An application of the present invention is illustrated in, but not limited to, the following example. In the application of 0.25 um silicon semiconductor technology to the current example, the current leakage of a metal oxide field effect transistor is about $1^{-10}$ amperes per unit transistor. The use of a capacitor as a load element, to offset such a transistor device current leakage, requires a capacitor with a nominal current of $1^{E-9}$ amperes per load element. Capacitor currents for this type of device current leakage can be between $5^{-10}$ and $2^{-9}$ amperes per load element, and he overall circuit will behave in a similar manner.

Figure 6:
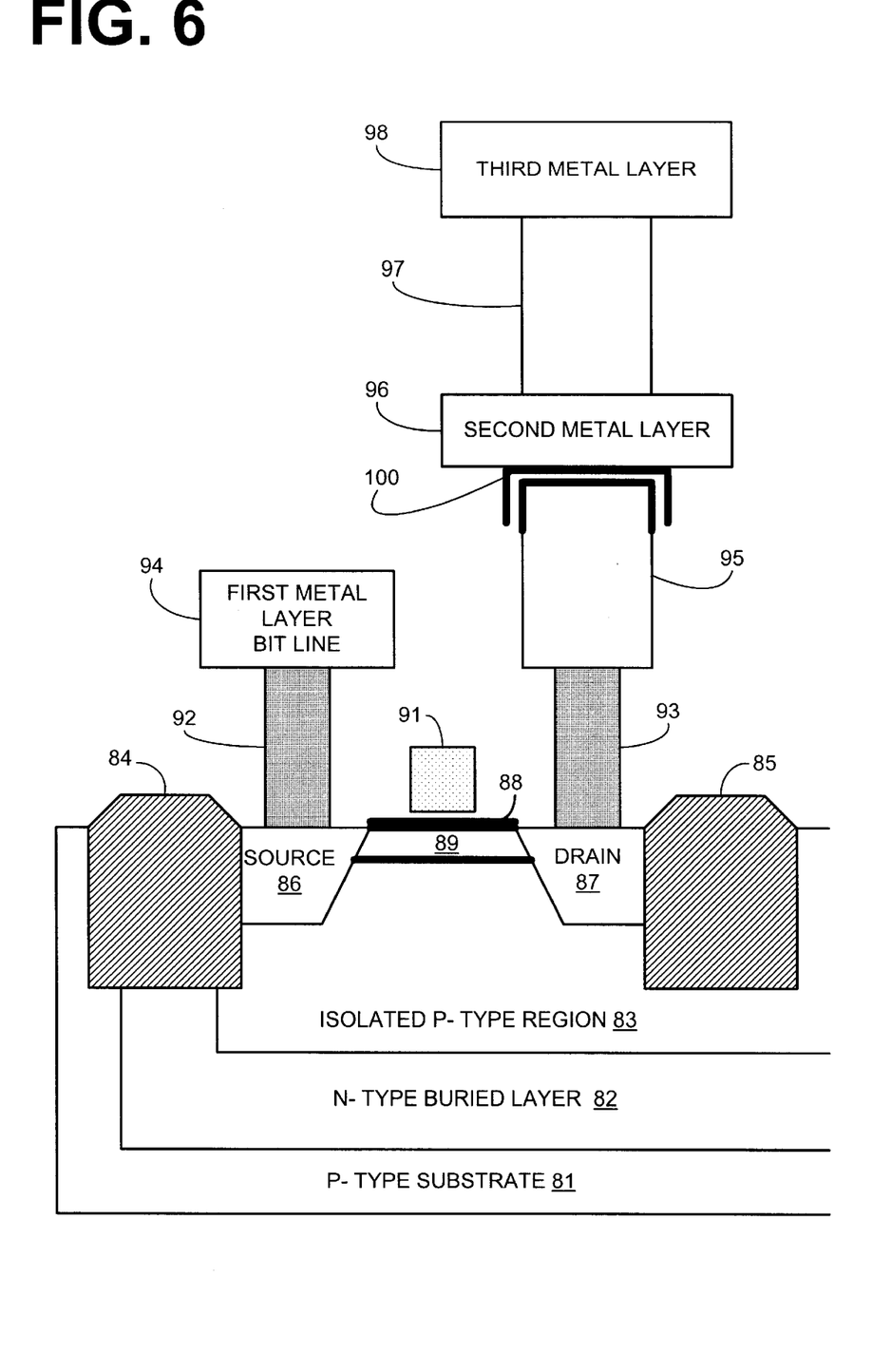
FIG. 6 is a cross-section diagram of the integrated circuit component for the capacitor load and access transistor of a dynamic memory cell of the present invention.

Illustrated in FIG. 6 is the cross sectional diagram of the capacitor used in the memory cell of the present invention.

The memory cell in FIG. 6 comprises a P-type substrate 81. The substrate 81 is preferably a silicon type substrate. An N-type layer 82 is formed on top of the P-type substrate 81 and an isolated P-type region 83 is then formed upon the N-type layer 82, thereby burying the N-type layer 82.

Field oxide dielectric layers 84 and 85 are formed to contact the P-type substrate 81, N-type buried layer 82 and the isolated P-type layer region 83. When voltage is applied, the source 86 and drain 87 components of the access transistor form a channel 89 within the isolated P-type region 83 between the source 86 and drain 87. A gate electrode 91 is then deposited on top of the oxide 88 to form a MOSFET transistor with the source 86 and drain 87.

Contact 92 is used to connect the first metal layer bit line 94 to the source 86. Contact 93, is used to connect the drain 87 to a metal cylinder 95. Contacts 92 and 93 can be self-aligned or non-self-aligned depending on the desired complexity of fabrication and circuit density.

For higher circuit density, a self-aligned contact is preferred. For simple fabrication a non-self-aligning contact is preferred. This is because a self-aligned contact can be placed very close to the MOSFET gate node without fear of a short circuit to that node. However, a self-aligned contact adds a masking step to the fabrication process. In today's cost sensitive era, the inventors contemplate that it might be prudent to use a non-self-aligned scheme in order to eliminate the extra masking step.

The metal cylinder 95 acts as a plug between leaky capacitor 100 of the present invention, and the contact 93. The metal cylinder 95 is utilized to provide for an expanded surface area for the capacitor 100 of the present invention, in order to maximize the capacitance and therefore the charge that the capacitor 100 is able to maintain. Since the capacitor dielectric is allowed to come in contact with all exposed surfaces of cylinder 95, any additional surface (top or side) will increase the area of the bottom plate of the capacitor thereby increasing the capacitance. The metal cylinder 95 includes, for example but not limited to, the metals of tungsten, titanium, titanium-nitride, and tantalum/tantalum-nitride.

Between the metal cylinder 95 and the second metal layer 96 is where the capacitor C1 61 or C2 62 of the present invention is formed. The method of fabricating a metal to metal capacitor on an integrated circuit is described in the commonly assigned U.S. Pat. No. 5,576,240, issued to Radosevich, et al., on Nov. 19, 1996, for "Method for Making a Metal to Metal Capacitor," and is herein incorporated by reference.

Metal cylinder 95 is utilized on top the contact 93 to expand the surface area for capacitor 100 as discussed above, and is situated between the second metal layer 96 and the contact 93.

In the alternative embodiment, the sides of the metal cylinder 95 can be utilized as surface area for depositing the dielectric or the capacitor 100 of the present invention, thereby increasing the total surface area of the capacitor. In this alternative embodiment, the sides of the second metal layer 96 are drawn down and around the sides of the metal cylinder 95. This allows the sides of the metal cylinder 95 to be utilized as surface area for the dielectric for the capacitor 100 of the present invention, This utilization of the sides of the metal cylinder 95 thereby further increases the total surface area of the capacitor 100. Because this alternative embodiment uses the structural elements of an existing contact, it uses no more area than a prior art contact, and yet provides a substantial increase in the total surface area of the capacitor.

On top of second metal layer 96 is a second metal cylinder 97. Metal cylinder 97 may include, for example but not limited to, the metals of tungsten, titanium, titanium-nitride, and tantalum/tantalum-nitride. Both metal cylinder 95 and metal cylinder 97 are fabricated first by using selective reactive ion etching and conventional photolithography techniques. Next, a glue/barrier layer is deposited on the surface. Then, a combination of a chemical vapor deposition and chemical mechanical polishing is used to form the metal cylinders 95 and 97, respectively.

A standard multi-level metal interconnection scheme is employed to complete the interconnection of the integrated circuit (i.e. connecting the memory sections to the logic sections) to form an embedded configuration.

The standard multi-level metal interconnect scheme could include other materials like Cu (copper), (W (tungsten), TiN (titanium nitrogen), TaN (tantalum nitrogen), Ru (ruthenium), Pt (platinum) and general barriers materials.

Figure 7:
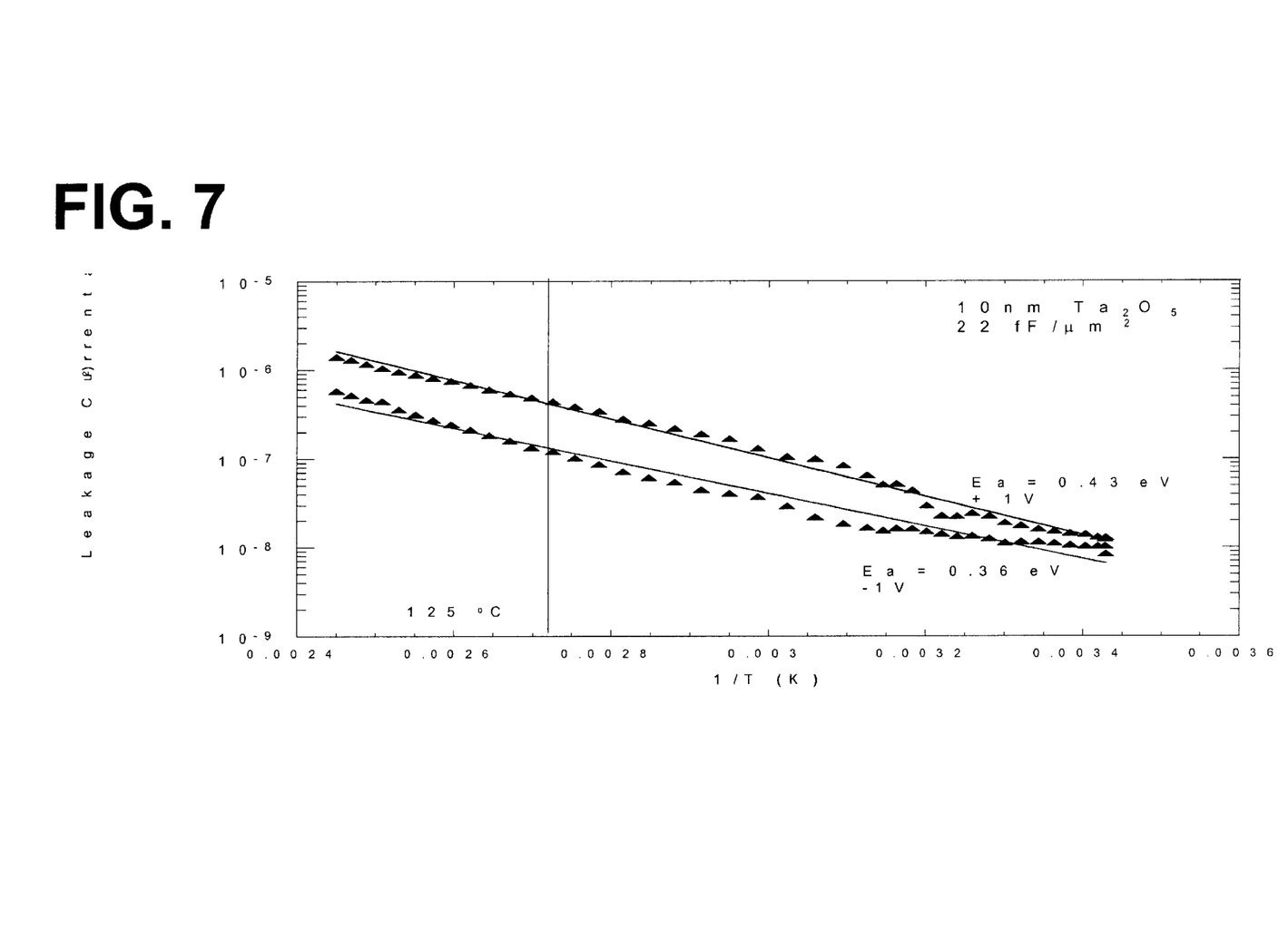
FIG. 7 is a graph illustrating the temperature dependence for an example Ta2O5 type capacitor of the present invention.

Illustrated in FIG. 7 is a graph of the temperature dependence for a capacitor dielectric of the present invention. The composition of the capacitor dielectric includes the use of Ta2O5 (tantalum pentoxide), TiO2 (titanium dioxide), or other capacitor dielectrics with a high dielectric constant to compensate (as temperature varies) for any other current leakage from the transistors. This compensation current, along with a particular capacitor and transistor interconnections will regulate (i.e. control) the logic levels of the memory cell in such a way that they settle into a stable static state independent of the temperature of operation.

As shown in FIG. 7, the temperature dependent capacitor leakage of the present invention supplies enough current to offset the current leakage found in the rest of the circuit as it varies with temperature. A capacitor having a dielectric that uses a tunneling current cannot do this because the dielectric is constant with temperature. All capacitors have frequency dependent impedance, however few have a finite impedance at 0 Hz (DC). The capacitors of the present invention, have a finite and uniquely appropriate value of impedance that can be adjusted to match, and track, the Ioff of any set of transistors as their current leakage varies with temperature.

The foregoing description has been presented for purposes of illustration and description. It is not intended to be exhaustive or to limit the invention to the precise forms disclosed. Obvious modifications or variations are possible in light of the above teachings.

The embodiment or embodiments discussed are chosen and described to provide a good illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A temperature insensitive memory cell apparatus comprising:
   at least one transistor having a current leakage; and
   at least one capacitor electrically connected to said transistor to act as a load element for said memory cell, said at least one capacitor having a temperature dependent capacitor leakage that tracks said current leakage as said at least one transistor varies with temperature.

2. The apparatus of claim 1, wherein said at least one capacitor further comprises:

a dielectric controlled by utilizing an optimal surface area and thickness for said dielectric.

3. The apparatus of claim 2, wherein said dielectric possesses a dielectric constant greater than about 10.

4. The apparatus of claim 2, wherein said dielectric is selected from the group consisting of tantalum pentoxide, titanium dioxide, barium strontium titanate, zirconium tin tintanate, and titanium oxide.

5. The apparatus of claim 4, wherein said dielectric permits a reduction in operating voltage for said temperature insensitive memory cell.

6. The apparatus of claim 1, wherein said at least one capacitor further comprises:

a dielectric material, said dielectric material having current drain in a range of about 5 to 20 times a current drain of said at least one transistor in an off condition.

7. A temperature insensitive memory cell apparatus comprising:

first and second bit lines;

a first transistor, said first transistor connected to said first bit line on a first transistor first contact;

a second transistor, said second transistor electrically connected to said second bit line on a second transistor first contact;

a first capacitor, said first capacitor electrically connected to a source current on a first capacitor first contact;

a second capacitor, said second capacitor electrically connected to said source current on a second capacitor first contact;

a third transistor, said third transistor electrically connected to a ground contact on a third transistor first contact, a second contact of said third transistor being electrically connected to a second contact of said first capacitor;

a fourth transistor, said fourth transistor electrically connected to a ground contact on a fourth transistor first contact, a second contact of said fourth transistor being electrically connected to a second contact of said second capacitor;

wherein a second contact of said first transistor is electrically connected to said fourth transistor second contact and a third transistor third contact, and wherein a first capacitor and said second capacitor act as a load element for said memory cell, said first capacitor and said second capacitor having a temperature dependent capacitor leakage that tracks a current leakage of said temperature insensitive memory cell as said temperature insensitive memory cell varies with temperature.

8. The apparatus of claim 7, wherein said first capacitor and second capacitor comprise a dielectric selected from the group consisting of tantalum pentoxide, titanium dioxide, barium strontium titanate, zirconium tin tintanate, and titanium oxide.

9. The apparatus of claim 8, wherein said dielectric permits a reduction in operating voltage for said temperature insensitive memory cell.

10. The apparatus of claim 7, wherein said first capacitor and second capacitor further comprise:

a dielectric controlled by utilizing an optimal surface area and thickness for said dielectric.

11. A method for forming a temperature insensitive memory cell apparatus, comprising the steps of:

providing a substrate;

forming a source contact on said substrate, wherein said source contact comprises a field oxide dielectric layer;

forming a drain contact on said substrate, wherein said drain contact comprises a field oxide dielectric layer;

forming a gate electrode on top of said field oxide to form a transistor;

forming a first contact on said source contact;

forming a first metal layer bit line on said first contact to connect said first contact to said first metal layer bit line;

forming a second contact on said drain contact;

fabricating a first plug on said second contact;

forming a capacitor on said first plug, said capacitor including a dielectric having a temperature dependent capacitor leakage that tracks a current leakage of said transistor as said transistor varies with temperature;

forming a second metal layer on said capacitor;

fabricating a second plug on said second metal layer; and forming a third metal layer on said second plug.

12. The method of claim 11, wherein the step of forming said capacitor on said first plug further comprises:

drawing said capacitor around a top and sides of said first plug.

13. The method of claim 11, wherein the step of fabricating said first plug further comprises:

constructing said first plug with a material selected from the group consisting of tungsten, titanium, titanium-nitride, and tantalum/tantalum-nitride.

14. The apparatus of claim 11, wherein the step of fabricating said second plug further comprises:

constructing said second plug with material selected from the group consisting of tungsten, titanium, titanium-nitride, and tantalum/tantalum-nitride.

15. The method of claim 11, wherein the step of forming said capacitor further comprises:

selecting a dielectric from the group consisting of tantalum pentoxide, titanium dioxide, barium strontium titanate, zirconium tin tintanate, and titanium oxide.

16. The method of claim 15, wherein said dielectric permits a reduction in operating voltage for said memory cell.

17. The method of claim 11, wherein the step of forming said capacitor further comprises:

utilizing an optimal surface area and thickness for said dielectric.

* * * * *